United States Patent [19]

Ting

[11] Patent Number: 5,568,430
[45] Date of Patent: Oct. 22, 1996

[54] SELF TIMED ADDRESS LOCKING AND DATA LATCHING CIRCUIT

[75] Inventor: Tah-Kang J. Ting, Hsinchu, Taiwan

[73] Assignee: Etron Technology, Inc., Hsin-chu, Taiwan

[21] Appl. No.: 567,016

[22] Filed: Dec. 4, 1995

[51] Int. Cl.⁶ .................................. G11C 7/00; G11C 8/00
[52] U.S. Cl. .................. 365/189.05; 365/189.08; 365/193; 365/230.08
[58] Field of Search ................ 365/189.05, 189.08, 365/193, 230.08

[56] References Cited

U.S. PATENT DOCUMENTS 5,488,581  1/1996  Nagao et al. .................. 365/189.05
5,490,114  2/1996  Butler et al. .................. 365/189.05

Primary Examiner—David C. Nelms
Assistant Examiner—Trong Phan
Attorney, Agent, or Firm—George O. Saile; Larry J. Prescott

[57] ABSTRACT

This invention provides an address locking and data latching timing control circuit for use in DRAMs using Extended Data Out (EDO) mode. The Extended Data Out (EDO) mode reduces the page mode cycle time with the same data period. This can result in loss of data if the data is not fully established and latched before the next column address arrives. The address locking and data latching timing control circuit of this invention locks the address input buffer and latches the data output buffer until the data is fully established and latched.

8 Claims, 5 Drawing Sheets

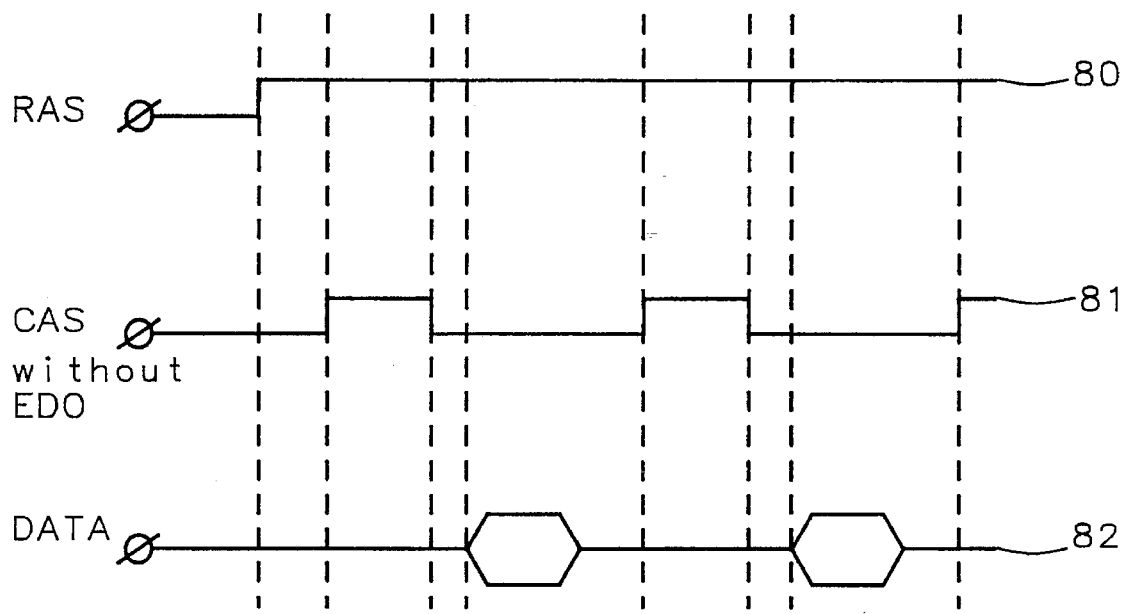
FIG. 1A - Prior Art
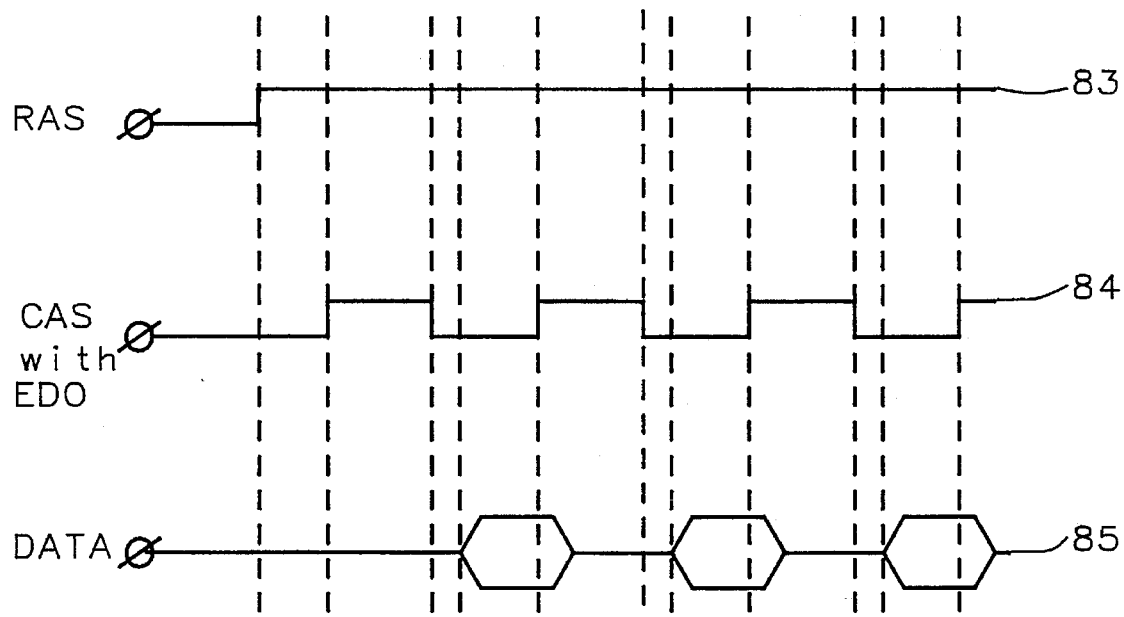
FIG. 1B - Prior Art

SELF TIMED ADDRESS LOCKING AND DATA LATCHING CIRCUIT

BACKGROUND OF THE INVENTION

1. Field of the Invention

This invention relates to Dynamic Random Access Memories, DRAMs, and more particularly to the prevention of data loss in DRAMs using Extended Data Out (EDO) mode. The invention provides a logic circuit which produces an address lock output and a data latch output. The address lock output is fed to an address input buffer and the data latch output is fed to a data output buffer. The address input buffer is locked and the data output buffer is latched until the data is established.

2. Description of Related Art

When the Extended Data Out (EDO) mode is used in Dynamic Random Access Memory arrays the page mode cycle time is reduced with the same data out cycle time. This can cause loss of data if the data is not fully established before the time window allocated to reading out the data is closed. This invention provides a self-timed address locking and data latching circuit to protect the data during readout.

SUMMARY OF THE INVENTION

In memory circuits, such as Dynamic Random Access Memory for example, when the Extended Data Out, or EDO, feature is used the page mode cycle time is reduced with the same data out period. This can cause a problem with data loss when using the EDO feature. FIG. 1A shows the timing cycle for conventional memory readout without the EDO feature. As shown in FIG. 1A with the Row Address Strobe, or RAS, 80 at a logical one level the data 82 is established after the Column Address Strobe, or CAS, 81 changes from a logical one to a logical zero. The data 82 must be established before the CAS 81 returns to the logical one level.

The data loss problem which can occur when using the EDO feature is shown in FIG. 1B. FIG. 1B shows the timing cycle for conventional memory readout with the EDO feature. As shown in FIG. 1B with the Row Address Strobe, or RAS, 83 at a logical one level the data 85 is established after the Column Address Strobe, or CAS, 84 changes from a logical one to a logical zero. When the EDO feature is used the Column Address Strobe 84 has a higher clock rate and the data 85 does not become completely established before the Column Address Strobe 84 changes from a logical zero to a logical one, as shown in FIG. 1B, resulting in loss of data.

It is an objective of this invention to provide a self-timed address locking and data latching circuit to prevent data loss in DRAM memory using EDO.

it is a further objective of this invention to provide a DRAM memory circuit using a self-timed address locking and data latching circuit to prevent data loss in the memory array using the EDO mode.

These objectives are accomplished by means of a data latch and address lock timing control circuit. The data latch and address lock timing control circuit provides an address lock output and a data latch output which will lock the address input buffer until the data is fully established and latched.

The address lock output goes to a logical one level when the CAS goes to a logical one level but remains at a logical one level after the CAS has returned to a logical zero level and until the address lock enable line returns to a logical zero level. The data latch output goes to a logical one level when the data latch enable line goes to a logical one and the CAS is at a logical zero or the address lock output goes to a logical zero and the CAS line is at a logical zero. The data latch output goes to a logical zero when the data latch enable line goes to a logical zero and the address lock output goes to a logical one or when the CAS line is at a logical one. The address lock output and the data latch output are used to lock the address input buffer until the data is fully established and latched into the data output buffer.

BRIEF DESCRIPTION OF THE DRAWINGS

FIG. 1A shows the timing cycle for the Row Address Strobe, the Column Address Strobe, and the data for a conventional DRAM without EDO.

FIG. 1B shows the timing cycle for the Row Address Strobe, the Column Address Strobe, and the data for a conventional DRAM with EDO.

DESCRIPTION OF THE PREFERRED EMBODIMENTS

Figure 2:
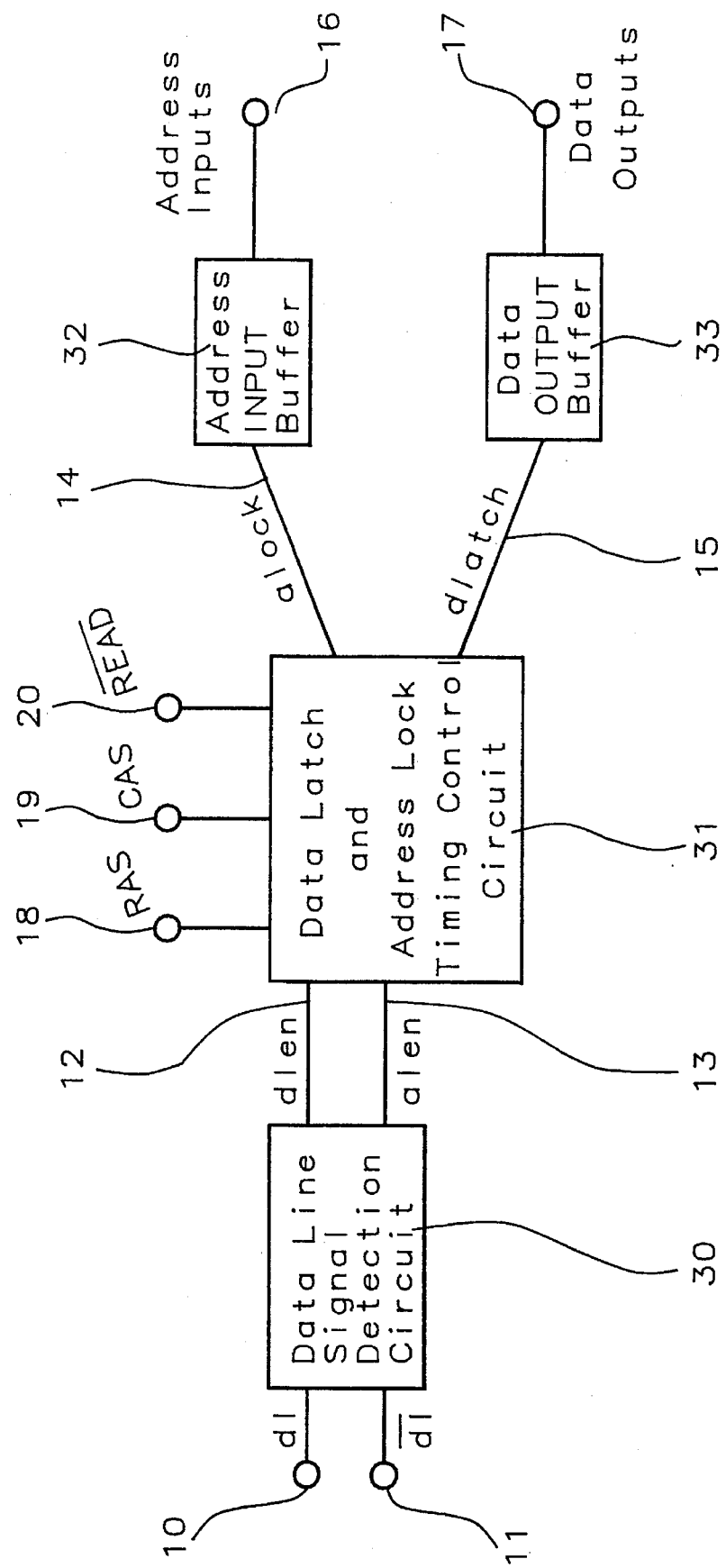
FIG. 2 shows a block diagram of the data latch and address lock timing control circuit used with a memory array.

Refer now to FIG. 2, there is shown a block diagram of the data latch and address lock timing control circuit of this invention used with a memory array circuit, such as a Dynamic Random Access Memory, used with the Extended Data Out feature. The data latch and address lock timing control circuit 31 has inputs from the Row Address Strobe, RAS, line 18, the Column Address Strobe, CAS, line 19, and from the inverse Read, READ, line 20. The data line signal detection circuit 30 has inputs from the data line 10 and the inverse data line 11 from the memory array, not shown, and has data line enable 12 and address line enable 13 outputs which are fed to inputs of the data latch and address lock timing control circuit 31. The data latch and address lock timing control circuit 31 has an address lock output 14 which is connected to the input of an address input buffer 32 and a data latch output 33 which is fed to the input of a data output buffer 33. The address input buffer 32 has a number of address inputs 16 and the data output buffer 33 has a number of data outputs 17.

When the address lock output 14 of the data latch and address lock timing control circuit 31 is at a logical one level the address currently in the address input buffer 32 is locked in the address input buffer 32 until the address lock output 14 returns to the logical zero level. When the data latch output 15 of the data latch and address lock timing control circuit 31 is at a logical one level the data in the data output buffer 33 is latched in the data output buffer 33 until the data latch output 15 returns to the logical zero level. This control of the address input buffer 32 and the data output buffer 33 prevents the loss of data if the Column Address Strobe, or CAS, line returns to logical one before the data has been fully established and latched when in the Extended Data Out mode.

Figure 3:
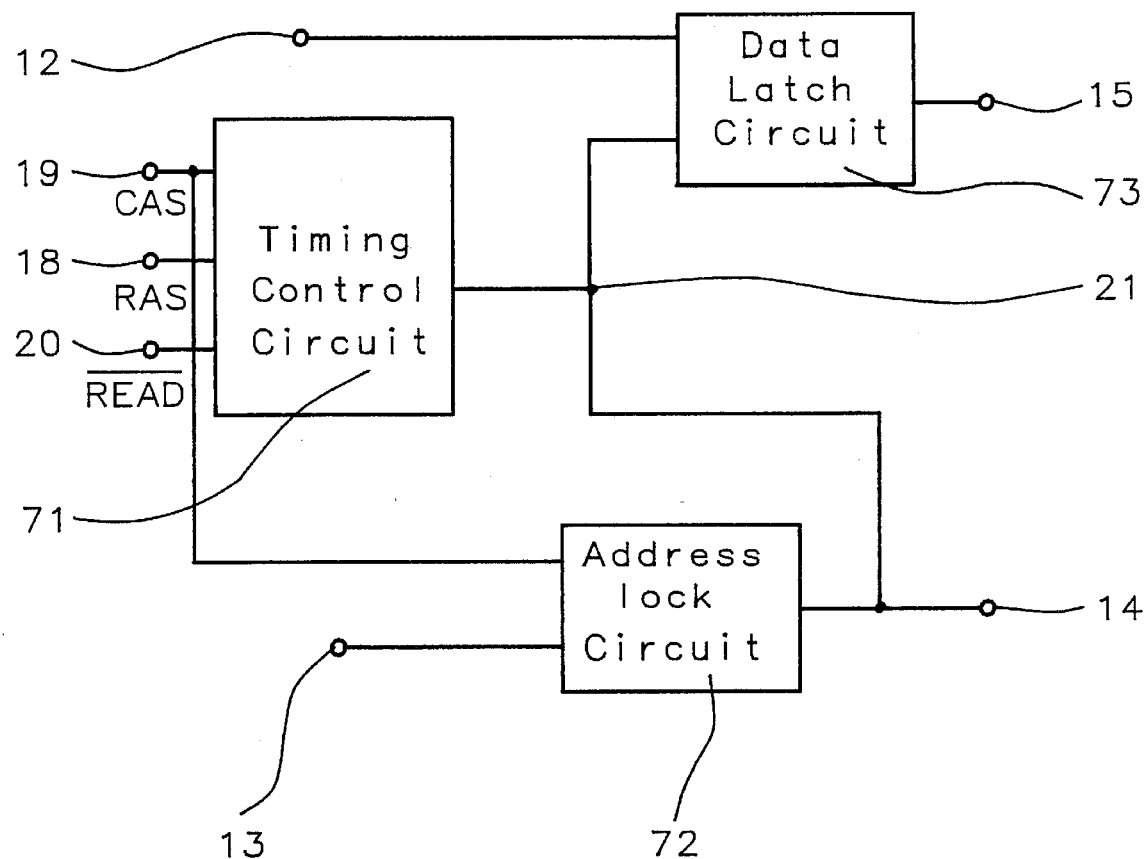
FIG. 3 shows a block diagram of the data latch and address lock timing control circuit.

Refer now to FIG. 3, there is shown a block diagram of the data latch and address lock timing control circuit shown as a timing control circuit 71, an address lock circuit 72, and a data latch circuit 73. The timing control circuit 71 has inputs connected to the CAS line 19, the RAS line 18, and the inverse Read $\overline{READ}$ line 20. The output 21 of the timing control circuit 71 is connected to the first input of the data latch circuit 73. The second input of the data latch circuit 73 is connected to the inverse data latch enable line 12 and the output 15 of the data latch circuit 73 is connected to the data output buffer, not shown in FIG. 3. The first input 13 of the address lock circuit 72 is connected to the inverse address lock enable line and the second input of the address lock circuit is connected to the CAS line 19. The output 14 of the address lock circuit 72 is connected to the first input 21 of the data latch circuit 73 as well as to the input of the address input buffer, not shown in FIG. 3.

When the RAS line 18 is at the logical zero level the output 21 of the timing control circuit 71 is at the logical zero level, the output 15 of the data latch circuit 73 is at the logical zero level, and the output 14 of the address lock circuit 72 has the same level as the CAS line 19. The part of the cycle of interest, however, is during the readout part of the cycle when the RAS line 18 is at a logical one level and the inverse Read line 20 is at a illogical zero level, the Read line is at a logical one level.

Figure 5:
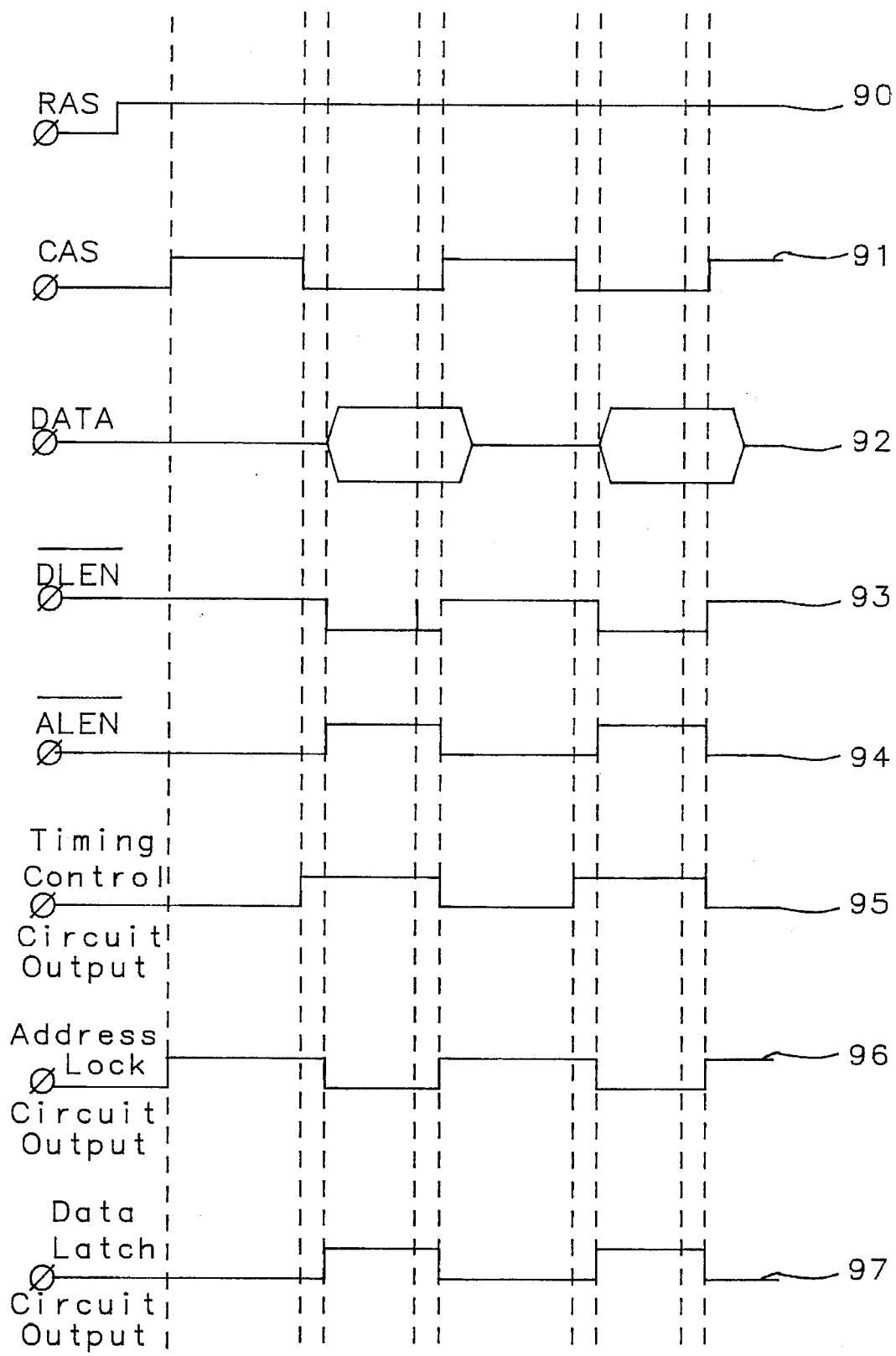
FIG. 5 shows the timing cycle for the Row Address Strobe, Column Address Strobe, data, inverse data lock enable, inverse address latch enable, timing control circuit output, address lock circuit output, and data latch circuit output for a DRAM with EDO using this invention.

After the RAS line 18 has gone to the logical one level, with the inverse Read line 20 at logical zero, the output 21 of the timing control circuit 71 remains at logical zero until the CAS 19 line has gone to logical one. The output 21 of the timing control circuit 71 remains at logical zero while the CAS line 19 is at logical one and goes to logical one when the CAS line 19 goes to logical zero. FIG. 5 shows the timing relationships of the RAS 90, CAS 91, and timing control circuit output 95. When the CAS line again becomes logical one the output 21 of the timing control circuit 71 becomes logical zero. The output 21 of the timing control circuit 71 is a logical zero whenever the CAS line is a logical 1. The output 21 of the timing control circuit 71 returns to logical one when the CAS line again becomes logical 0.

The output 14 of the address lock circuit 72 is a logical one whenever the CAS line 19 is a logical one. After the CAS line 19 drops to logical zero, the output 14 of the address lock circuit 72 remains at logical one until the inverse address lock enable line 13 changes from logical zero to logical one and the address lock enable line changes from logical one to logical zero. FIG. 5 shows the timing relationships of the RAS 90, CAS 91, inverse address lock enable 94, and address lock circuit output 96.

The output 15 of the data latch circuit 73 is at logical zero until the inverse data latch enable line 12 changes from logical one to logical zero, the data latch enable line changes from logical zero to logical one, and then becomes logical one. The output 15 of the data latch circuit 73 remains at logical one until either the output 21 of the timing control circuit 71 or the output 14 of the address lock circuit 72 changes from logical one to logical zero and then becomes logical zero. FIG. 5 shows the timing relationships of the RAS 90, CAS 91, inverse data latch enable 93, timing control circuit output 95, address lock circuit output 96, and data latch circuit output 97.

Refer again to FIG. 5 showing the timing relationships of the RAS 90, CAS 91, data 92, address lock circuit output 96, and data latch circuit output 97. When the CAS changes from logical zero to logical one a new address is brought in to select a new set of data. If the data from the previous address selection is not established before the new address comes in the data from the previous address selection will be flushed out before it is established and will be lost. As can be seen in FIG. 5 the data is not fully established before the CAS 91 changes from logical zero to logical one bringing in a new address. However, the output of the address lock circuit 96 and the output of the data latch circuit 97 protect the data until it is fully established and latched.

Figure 4:
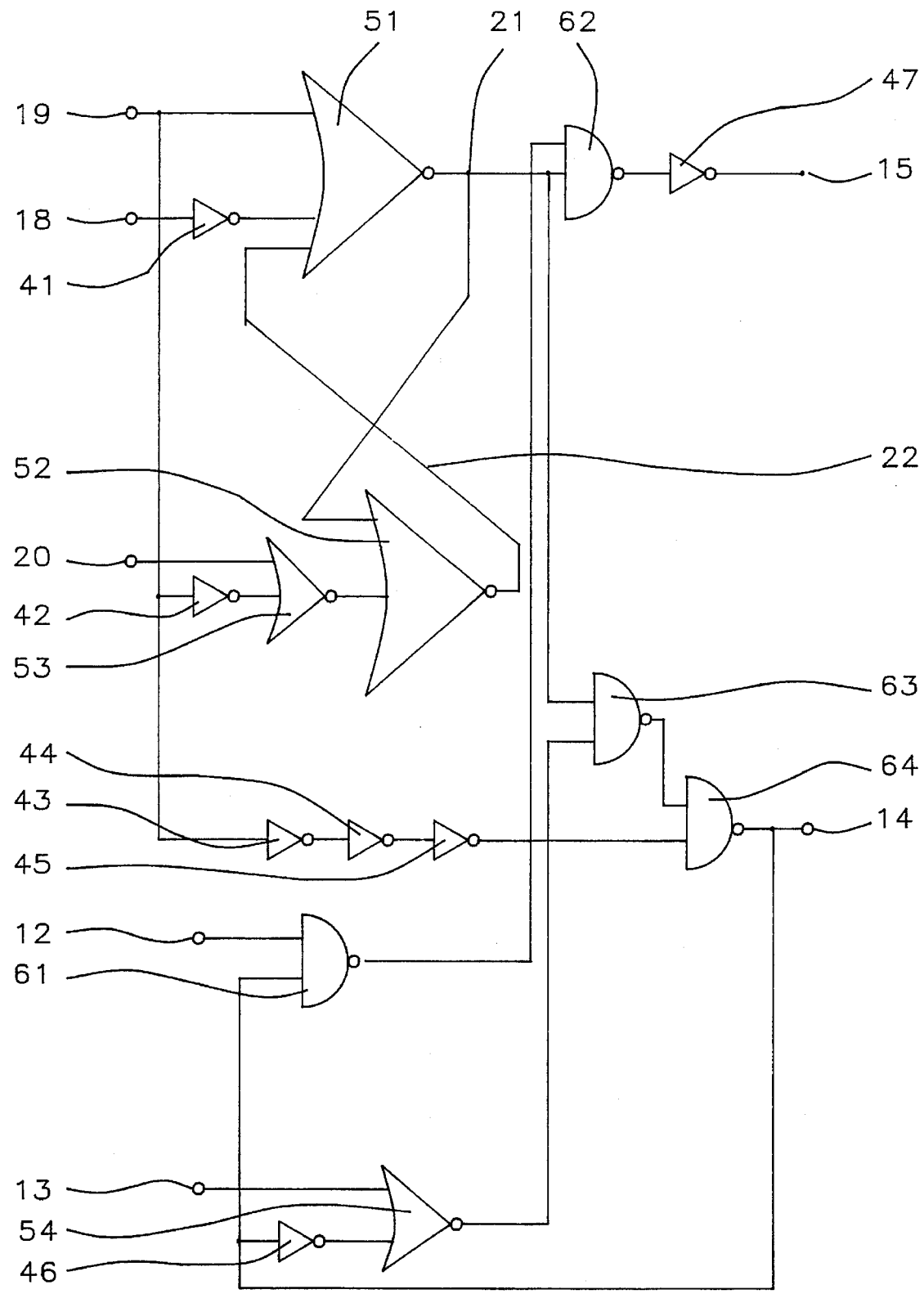
FIG. 4 shows a logic diagram of the data latch and address lock timing control circuit.

Refer now to FIG. 4, there is shown an example of a logic diagram which will realize the block diagram of FIG. 3 and the timing relationships shown in FIG. 5. The timing control circuit is made up of a first 51, second 53, and third 52 OR INVERT or NOR circuits and a first 41 and second 42 inverter circuits. The output 22 of the third NOR circuit 52 is connected to one input of the first NOR circuit 51 and the output 21 of the first NOR circuit 51 is connected to one input of the third NOR circuit 52. The output 21 of the first NOR circuit 51 is the output of the timing control circuit. One input of the first NOR circuit 51 is connected to the CAS line 19. The RAS line 18 is connected in series with the first inverter 41 to an input of the first NOR circuit 51. The CAS line 19 is connected in series with the second inverter 42 to an input of the second NOR circuit 53. The other input of the second NOR circuit 53 is connected to the inverse Read line 20. The output of the second NOR circuit 53 is connected to an input of the third NOR circuit 52.

Refer now to FIG. 4 and the timing relationships of the RAS 90, CAS 91, and timing control circuit output 95 shown in FIG. 5. When the RAS line 18 is logical zero the output 21 of the first NOR circuit 51, which is also the output of the timing control circuit, is a logical zero. When the CAS line 19 is a logical one the output 21 of the first NOR circuit 51 is a logical zero. When the RAS line 18 switches to logical one with CAS 19 remaining at logical zero the output of the first NOR circuit 51 remains at logical zero. With the RAS line 18 at logical one, when the CAS line 19 switches to logical one the output 21 of the first NOR circuit 51 remains at logical zero. When the RAS line 18 is a logical one and the inverse Read line 20 is a logical zero, the output 21 of the first NOR circuit 51 switches to logical one when the CAS line 19 switches from logical one to logical zero and remains at logical one until the CAS line switches from logical zero to logical one when the output 21 of the first NOR circuit 51 switches to logical zero. With the RAS line 18 remaining at logical one and the inverse Read line 20 remaining at logical zero the cycle repeats with the output 21 of the first NOR circuit 51 at logical one when the CAS line 19 is at logical zero and logical zero when the CAS line is at logical one. If the inverse read line were at logical one the output 21 of the timing control circuit 51 would remain at logical zero through the entire cycle.

Refer again to FIG. 4, the address lock circuit is made up of a fourth NOR circuit 54, a first AND INVERT or NAND circuit 63, a second NAND circuit 64, a third inverter 46, a fourth inverter 43, a fifth inverter 44, and a sixth inverter 45. One input of the first NAND circuit 63 is connected to the output 21 of the timing control circuit. The output of the first NAND circuit 63 is connected to one input of the second NAND circuit 64. The output 14 of the second NAND circuit 64 is also the output of the address lock circuit. The CAS line 19 is connected in series with the fourth 43, fifth 44, and sixth 45 inverters to the other input of the second NAND circuit 64. One input of the fourth NOR circuit 54 is connected to the inverse address lock enable line 13. The output of the address lock circuit 14 is connected in series with the third inverter 46 to the other input of the fourth NOR circuit 54. The output of the fourth NOR circuit 54 is connected to an input of the first NAND circuit 63.

Refer now to FIG. 4 and the timing relationships of the RAS 90, CAS 91, inverse address lock enable 94, timing control circuit output 95, and address lock circuit output 96 shown in FIG. 5. When the CAS line 19 is a logical one the output of the address lock circuit 14 is a logical one. When the CAS line 19 is a logical zero and the output of the timing control circuit 21 is a logical zero the output of the address lock circuit 14 is a logical zero. When the CAS line 19 switches from logical one to logical zero the output 14 of the address lock circuit remains a logical one until the inverse address lock enable line 13 switches from zero to one when it switches to logical zero, since the output of the timing control circuit 21 remains a logical one during the interval the CAS line 19 is a logical zero.

Refer again to FIG. 4. The data latch circuit is made up of a third NAND circuit 61, a fourth NAND circuit 62, and a seventh inverter 47. One input of the third NAND circuit 61 is connected to the inverse data latch enable line 12. The other input of the third NAND circuit 61 is connected to the output 14 of the address lock circuit. The output of the third NAND circuit 61 is connected to one input of the fourth NAND circuit 62. The other input of the fourth NAND circuit 62 is connected to the output 21 of the timing control circuit. The output of the fourth NAND circuit is connected to the input of the seventh inverter 47. The output 15 of the seventh inverter 47 is the output of the data latch circuit.

Refer now to FIG. 4 and the timing relationships of the RAS 90, CAS 91, inverse data latch enable 93, timing control circuit output 95, and data latch circuit 97 shown in FIG. 5. The output 15 of the data latch circuit is a logical zero if the output 21 of the timing control circuit is a logical zero. If the output 21 of the timing control circuit is a logical one the output 15 of the data latch circuit is a logical one if the inverse data latch enable line 12 is a logical zero or the output 14 of the address latch circuit is a logical zero. If the output 21 of the timing control circuit is a logical one the output 15 of the data latch circuit is a logical zero if the inverse data latch enable line 12 is a logical one and the output 14 of the address latch circuit is a logical one.

Refer now to FIG. 5. The address lock circuit output 96 switches to a logical one when the CAS 91 switches to a logical one and remains at logical one until the inverse address lock enable line 94 switches to logical one, or the address lock enable line switches to a logical zero. When the output of the address lock circuit is fed to the address input buffer the address input buffer is locked until the data 92 is established. The output of the data latch circuit 97 switches to a logical one when the inverse data latch enable line 93 switches to a logical zero, the data latch enable line switches to a logical one. The output of the data latch circuit remains a logical one until the CAS 91 switches back to a logical one. When the output of the data latch circuit is fed to the data output buffer the data output buffer is latched until the CAS switches to a logical one to begin the next column readout. The logic circuit of FIG. 4 will produce the desired outputs for the address lock circuit and the data latch circuit.

While the invention has been particularly shown and described with reference to the preferred embodiments thereof, it will be understood by those skilled in the art that various changes in form and details may be made without departing from the spirit and scope of the invention.

What is claimed is:

1. A data and address control circuit, comprising;

a row address strobe line;

a column address strobe line;

an inverse read line;

a data latch enable line;

an address lock enable line;

a timing control circuit having a first input, a second input, a third input and an output wherein said first input of said timing control circuit is connected to said column address strobe line, said second input of said timing control circuit is connected to said row address strobe line, said third input of said timing control circuit is connected to said inverse read line, said output of said timing control circuit is at a logical zero level when said row address strobe line is at a logical zero level or said column address strobe line is at a logical one level, and said output of said timing control circuit is at a logical one level when said row address strobe line is at a logical one level, said inverse read line is at a logical zero level, and said column address strobe line has switched from a logical one level to a logical zero level;

an address lock circuit having a first input, a second input, and an output wherein said first input of said address lock circuit is connected to said column address strobe line, said second input of said address lock circuit is connected to said address lock enable line, said output of said address lock circuit is at a logical one level if said column address strobe line is at a logical one level, said output of said address lock circuit is at a logical one level if said address lock enable line is at a logical one level and said output of said timing control circuit is at a logical one level; and a data latch circuit having a first input, a second input, and an output wherein said first input is connected to said data latch enable line, said second input is connected to said output of said timing control circuit and to said output of said address lock circuit, said output of said data latch circuit is at a logical one level if said output of said timing control circuit is at a logical one level and said data latch enable line is at a logical one level, and said output of said data latch circuit is at a logical one level if said output of said timing control circuit is at a logical one level and said output of said address lock circuit is at a logical zero level.

2. The timing control circuit of claim 1 wherein said timing control circuit comprises:

a first inverter having an input and an output wherein said input of said first inverter is connected to said row address strobe line:

a first NOR circuit having a first input, a second input, a third input, and an output and wherein said first input of said first NOR circuit is connected to said column address strobe line, said second input of said first NOR circuit is connected to said output of said first inverter, and said output of said first NOR circuit is said timing control circuit output;

a second inverter having an input and an output wherein said input of second inverter is connected to said column address strobe line;

a second NOR circuit having a first input, a second input, and an output wherein said first input of said second NOR circuit is connected to said inverse read line and said second input of said second NOR circuit is connected to said output of said second inverter; and a third NOR circuit having a first input, a second input, and an output wherein said first input of said third NOR circuit is connected to said output of said first NOR circuit, said second input of said third NOR circuit is connected to said output of said second NOR circuit, and said output of said third NOR circuit is connected to said third input of said first NOR circuit.

3. The timing control circuit of claim 1 wherein said address lock circuit comprises:

a fourth NOR circuit having a first input, a second input and an output wherein said first input of said fourth NOR circuit is connected to said address lock enable line;

a third inverter having an input and an output wherein said output of said third inverter is connected to said second input of said fourth NOR circuit;

a first NAND circuit having a first input, a second input, and an output wherein said first input of said first NAND circuit is connected to said output of said fourth NOR circuit and said second input of said first NAND circuit is connected to said output of said timing control circuit;

a fourth inverter having an input and an output wherein said input of said fourth inverter is connected to said column address strobe line;

a fifth inverter having an input and an output wherein said input of said fifth inverter is connected to said output of said fourth inverter;

a sixth inverter having an input and an output wherein said input of said sixth inverter is connected to said output of said fifth inverter; and a second NAND circuit having a first input, a second input, and an output wherein said first input of said second NAND circuit is connected to said output of said sixth inverter, said second input of said second NAND circuit is connected to said output of said first NAND circuit, and said output of said second NAND circuit is said output of said address lock circuit.

4. The timing control circuit of claim 1 wherein said data latch circuit comprises:

a third NAND circuit having a first input, a second input, and an output wherein said first input of said third NAND circuit is connected to said output of said address lock circuit and said second input of said third NAND circuit is connected to said data latch enable line;

a fourth NAND circuit having a first input, a second input, and an output wherein said first input of said fourth NAND circuit is connected to said output of said timing control circuit and said second input of said fourth NAND circuit is connected to said output of said third NAND circuit; and a seventh inverter having an input and an output wherein said input of said seventh inverter is connected to said output of said fourth NAND circuit and said output of said seventh inverter is said output of said data latch circuit.

5. A memory array control circuit, comprising:

a row address strobe line;

a column address strobe line;

an inverse read line;

a data latch enable line;

an address lock enable line;

a timing control circuit having a first input, a second input, a third input and an output wherein said first input of said timing control circuit is connected to said column address line, said second input of said timing control circuit is connected to said row address strobe line, said third input of said timing control circuit is connected to said inverse read line, said output of said timing control circuit is at a logical zero level when said row address strobe line is at a logical zero level or said column address strobe line is at a logical one level, and said output of said timing control circuit is at a logical one level when said row address strobe line is at a logical one level, said inverse read line is at a logical zero level, and said column address strobe line has switched from a logical one level to a logical zero level;

an address lock circuit having a first input, a second input, and an output wherein said first input of said address lock circuit is connected to said column address strobe line, said second input of said address lock circuit is connected to said address lock enable line, said output of said address lock circuit is at a logical one level if said column address strobe line is at a logical one level, said output of said address lock circuit is at a logical one level if said address lock enable line is at a logical one level and said output of said timing control circuit is at a logical one level;

a data latch circuit having a first input, a second input, and an output wherein said first input is connected to said data latch enable line, said second input is connected to said output of said timing control circuit and to said output of said address lock circuit, said output of said data latch circuit is at a logical one level if said output of said timing control circuit is at a logical one level and said data latch enable line is at a logical one level, and said output of said data latch circuit is at a logical one level if said output of said timing control circuit is at a logical one level and said output of said address lock circuit is at a logical zero level;

a data circuit having a data line input, an inverse data line input, a data line enable output, and an address line enable output wherein said data circuit data line enable output is connected to said data latch circuit data line enable input and said data circuit address line enable output is connected to said address lock latch circuit address lock enable line input;

an address input buffer having an address lock input and a number of address inputs wherein said address input buffer address lock input is connected to said address lock circuit output and said address inputs are connected to address signals;

a data output buffer having a data latch input and a number of data outputs wherein said data output buffer data latch input is connected to said data latch circuit output, wherein:

the address signals being prevented from entering said address input buffer when said address input buffer address lock input is at a logical one level; and the contents of said data output buffer being retained in said data output buffer when said data output buffer data latch input is at a logical one level.

6. The memory array control circuit of claim 5 wherein said timing control circuit comprises:

a first inverter having an input and an output wherein said input of said first inverter is connected to said row address strobe line:

a first NOR circuit having a first input, a second input, a third input, and an output and wherein said first input of said first NOR circuit is connected to said column address strobe line, said second input of said first NOR circuit is connected to said output of said first inverter, and said output of said first NOR circuit is said timing control circuit output;

a second inverter having an input and an output wherein said input of second inverter is connected to said column address strobe line;

a second NOR circuit having a first input, a second input, and an output wherein said first input of said second NOR circuit is connected to said inverse read line and said second input of said second NOR circuit is connected to said output of said second inverter; and a third NOR circuit having a first input, a second input, and an output wherein said first input of said third NOR circuit is connected to said output of said first NOR circuit, said second input of said third NOR circuit is connected to said output of said second NOR circuit, and said output of said third NOR circuit is connected to said third input of said first NOR circuit.

7. The memory array control circuit of claim 5 wherein said address lock circuit comprises:

a fourth NOR circuit having a first input, a second input and an output wherein said first input of said fourth NOR circuit is connected to said address lock enable line;

a third inverter having an input and an output wherein said output of said third inverter is connected to said second input of said fourth NOR circuit;

a first NAND circuit having a first input, a second input, and an output wherein said first input of said first NAND circuit is connected to said output of said fourth NOR circuit and said second input of said first NAND circuit is connected to said output of said timing control circuit;

a fourth inverter having an input and an output wherein said input of said fourth inverter is connected to said column address strobe line;

a fifth inverter having an input and an output wherein said input of said fifth inverter is connected to said output of said fourth inverter;

a sixth inverter having an input and an output wherein said input of said sixth inverter is connected to said output of said fifth inverter; and a second NAND circuit having a first input, a second input, and an output wherein said first input of said second NAND circuit is connected to said output of said sixth inverter, said second input of said second NAND circuit is connected to said output of said first NAND circuit, and said output of said second NAND circuit is said output of said address lock circuit.

8. The memory array control circuit of claim 5 wherein said data latch circuit comprises:

a third NAND circuit having a first input, a second input, and an output wherein said first input of said third NAND circuit is connected to said output of said address lock circuit and said second input of said third NAND circuit is connected to said data latch enable line;

a fourth NAND circuit having a first input, a second input, and an output wherein said first input of said fourth NAND circuit is connected to said output of said timing control circuit and said second input of said fourth NAND circuit is connected to said output of said third NAND circuit; and a seventh inverter having an input and an output wherein said input of said seventh inverter is connected to said output of said fourth NAND circuit and said output of said seventh inverter is said output of said data latch circuit.

* * * * *